US012622060B2

(12) United States Patent
Lu et al.

(10) Patent No.: US 12,622,060 B2
(45) Date of Patent: May 5, 2026

(54) DISPLAY SUBSTRATE, METHOD FOR PREPARING DISPLAY SUBSTRATE, AND DISPLAY DEVICE

(71) Applicant: BOE Technology Group Co., Ltd., Beijing (CN)

(72) Inventors: Tianhao Lu, Beijing (CN); Dejiang Zhao, Beijing (CN); Qian Sun, Beijing (CN); Wei Huang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 731 days.

(21) Appl. No.: 17/920,340

(22) PCT Filed: May 20, 2021

(86) PCT No.: PCT/CN2021/094918
§ 371 (c)(1),
(2) Date: Oct. 20, 2022

(87) PCT Pub. No.: WO2021/249149
PCT Pub. Date: Dec. 16, 2021

(65) Prior Publication Data
US 2023/0163142 A1 May 25, 2023

(30) Foreign Application Priority Data
Jun. 10, 2020 (CN) .......................... 202010524566.X

(51) Int. Cl.
*H10D 86/60* (2025.01)
*H10D 86/01* (2025.01)
(Continued)

(52) U.S. Cl.
CPC ........... *H10D 86/60* (2025.01); *H10D 86/021* (2025.01); *H10D 86/451* (2025.01);
(Continued)

(58) Field of Classification Search
CPC .... H10D 86/60; H10D 86/451; H10D 86/021; H10H 20/8515; H01L 24/03;
(Continued)

(56) References Cited

U.S. PATENT DOCUMENTS

2019/0115546 A1* 4/2019 Lu .......................... H10K 59/122
2019/0198599 A1* 6/2019 Son ..................... H10K 59/1315
(Continued)

FOREIGN PATENT DOCUMENTS

CN 107272270 A 10/2017
CN 107634087 A 1/2018
(Continued)

OTHER PUBLICATIONS

CN202010524566.X first office action.
PCT/CN2021/094918 international search report.

*Primary Examiner* — Jeff W Natalini
*Assistant Examiner* — Ian Isaac Degrasse
(74) *Attorney, Agent, or Firm* — IPro, PLLC

(57) ABSTRACT

Multiple first recesses are formed on the side of an inorganic insulating layer facing towards multiple LEDs. Ortho-graphic projections of the first recesses on a driving sub-strate do not overlap orthographic projections of the LEDs on the driving substrate. Thus, when a first planarization layer covering the multiple LEDs is formed on the side of the multiple LEDs facing away from the driving substrate, the first recesses can be filled with the first planarization layer, so that a contact area between the first planarization layer and the inorganic insulating layer can be increased, a binding force between the first planarization layer and the inorganic insulating layer can be increased, and the risk of peeling off the first planarization layer can be reduced, thereby improving the stability of a QD-LED device.

14 Claims, 9 Drawing Sheets

(51) Int. Cl.

| | | |
|---|---|---|
| *H10D 86/40* | (2025.01) | |
| *H10W 72/90* | (2026.01) | |
| *H10W 90/00* | (2026.01) | |
| *H10H 20/851* | (2025.01) | |
| *H10W 72/00* | (2026.01) | |

(52) U.S. Cl.
CPC ........ *H10W 90/00* (2026.01); *H10H 20/8515* (2025.01); *H10W 72/01953* (2026.01); *H10W 72/90* (2026.01); *H10W 72/9415* (2026.01); *H10W 90/792* (2026.01)

(58) Field of Classification Search
CPC ....... H01L 24/05; H01L 24/08; H01L 25/167; H01L 2224/0361; H01L 2224/05567; H01L 2224/05573; H01L 2224/08145; H01L 2924/12041
See application file for complete search history.

(56) References Cited

U.S. PATENT DOCUMENTS

| | | | | |
|---|---|---|---|---|
| 2019/0245022 A1 * | 8/2019 | Zhou | ...................... | H10K 71/00 |
| 2019/0252576 A1 | 8/2019 | Lee et al. | | |

| | | | | |
|---|---|---|---|---|
| 2020/0106048 A1 | 4/2020 | Xu et al. | | |
| 2020/0161503 A1 * | 5/2020 | Chen | ...................... | H10D 86/40 |
| 2020/0168663 A1 | 5/2020 | Choi et al. | | |
| 2020/0168669 A1 * | 5/2020 | Chen | ................... | H10K 59/8792 |
| 2020/0388788 A1 * | 12/2020 | Long | ................... | H10K 59/873 |
| 2021/0367003 A1 | 11/2021 | Zhou et al. | | |
| 2021/0398952 A1 * | 12/2021 | Zhang | ................... | H10D 86/60 |

FOREIGN PATENT DOCUMENTS

| | | | | | |
|---|---|---|---|---|---|
| CN | 110112141 A | * | 8/2019 | ......... | H01L 25/0753 |
| CN | 110618555 A | | 12/2019 | | |
| CN | 110828484 A | | 2/2020 | | |
| CN | 111223885 A | | 6/2020 | | |
| CN | 111627951 A | | 9/2020 | | |

* cited by examiner

S1001

Form a first insulating layer on the driving substrate

S1002

Form a second insulating layer on one side of the first insulating layer facing away from the driving substrate

S1003

Etch the second insulating layer to form the plurality of first recesses

DISPLAY SUBSTRATE, METHOD FOR PREPARING DISPLAY SUBSTRATE, AND DISPLAY DEVICE

CROSS REFERENCE TO RELATED APPLICATIONS

The present disclosure is a national phase entry under 35 U.S.C. § 371 of International Application No. PCT/CN2021/094918, filed on May 20, 2021, which claims the priority of Chinese Patent Application No. 202010524566.X, filed with the China National Intellectual Property Administration on Jun. 10, 2020 and entitled "DISPLAY PANEL, MANUFAC-TURING METHOD THEREFOR, AND DISPLAY APPA-RATUS", the entire contents of which are incorporated herein by reference.

FIELD

The present disclosure relates to the technical field of display, in particular to a display substrate, a manufacturing method therefor, and a display apparatus.

BACKGROUND

LED has advantages of low power consumption and high brightness, and a photoinduced quantum dot (QD) material has a wide color gamut and pure light color, therefore a QD-LED device structure provides an opportunity to achieve high-quality display with low power consumption, high brightness and wide color gamut.

SUMMARY

Embodiments of the present disclosure provide a display substrate, including:

a driving substrate;

a plurality of LEDs, arranged on the driving substrate in an array;

an inorganic insulating layer, located between the driving substrate and the plurality of LEDs; wherein a plurality of first recesses are provided in one side of the inorganic insulating layer facing the plurality of LEDs, and orthographic projections of the first recesses on the driving substrate do not overlap orthographic projections of the LEDs on the driving substrate; and a first planarization layer, covering the plurality of LEDs, wherein a plurality of bulges filling the first recesses are provided on one side of the first planarization layer facing the driving substrate.

Optionally, during implementations, in the above display substrate provided by the embodiments of the present disclosure, the inorganic insulating layer includes: a first insulating layer located between the driving substrate and the plurality of LEDs, and a second insulating layer located between the first insulating layer and the plurality of LEDs. The second insulating layer and the first insulating layer are different in material.

The plurality of first recesses are formed in one side of the second insulating layer facing the plurality of LEDs.

Optionally, during implementations, in the above display substrate provided by the embodiments of the present disclosure, a thickness of the first insulating layer is 0.2 μm-1 μm, and a thickness of the second insulating layer is 2 μm-3 μm.

Optionally, during implementations, in the above display substrate provided by the embodiments of the present disclosure, the inorganic insulating layer is a single inorganic insulating layer, and a thickness of the single inorganic insulating layer is 2 μm-3 μm.

Optionally, during implementations, the above display substrate provided by the embodiments of the present disclosure further includes a blocking dam structure located on one side of the first planarization layer facing away from the driving substrate. The blocking dam structure has a plurality of pixel openings, and the pixel openings are in one-to-one correspondence with the LEDs.

The pixel openings include a first sub-pixel opening and a second sub-pixel opening. A red quantum dot color film is disposed in the first sub-pixel opening, and a green quantum dot color film is disposed in the second sub-pixel opening.

Optionally, during implementations, in the above display substrate provided by the embodiments of the present disclosure, the pixel openings further include a third sub-pixel opening, and the third sub-pixel opening is filled with scattered particles.

Optionally, during implementations, in the above display substrate provided by the embodiments of the present disclosure, the first planarization layer internally has a plurality of scattered particles.

Optionally, during implementations, in the above display substrate provided by the embodiments of the present disclosure, one side of the first planarization layer facing the blocking dam structure is provided with a plurality of second recesses, and the second recesses are filled with the blocking dam structure.

Optionally, during implementations, the above display substrate provided by the embodiments of the present disclosure further includes an encapsulation layer, covering the red quantum dot color film, the green quantum dot color film, and the blocking dam structure.

Optionally, during implementations, in the above display substrate provided by the embodiments of the present disclosure, in a direction perpendicular to a thickness of a driving substrate, a cross section shape of the first recess is one or a combination of an isosceles trapezoid, a right-angled trapezoid, or a rectangle.

Optionally, during implementations, in the above display substrate provided by the embodiments of the present disclosure, the driving substrate includes: a base substrate, a drive circuit located on one side of the base substrate facing the LEDs, a second planarization layer located on one side of the drive circuit facing the LEDs, and a first electrode and a second electrode which are located on one side of the second planarization layer facing the LEDs; and the first electrode is electrically connected with the drive circuit through a first via hole penetrating through the second planarization layer, and the second electrode is grounded.

One side of the LEDs facing the driving substrate includes a third electrode and a fourth electrode, the third electrode is electrically connected with the first electrode through a second via hole penetrating through the inorganic insulating layer, and the fourth electrode is electrically connected with the second electrode through a third via hole penetrating through the inorganic insulating layer.

Optionally, during implementations, in the above display substrate provided by the embodiments of the present disclosure, the LEDs are Micro LEDs.

Accordingly, embodiments of the present disclosure provide a display apparatus, including the above display substrate provided by the embodiments of the present disclosure.

Accordingly, embodiments of the present disclosure further provide a method for preparing the above display substrate provided by the embodiments of the present disclosure, including:

providing a driving substrate;

forming an inorganic insulating layer on the driving substrate;

forming a plurality of first recesses in one side of the inorganic insulating layer facing away from the driving substrate;

forming a plurality of LEDs on one side of the inorganic insulating layer facing away from the driving substrate, wherein orthographic projections of the first recesses on the driving substrate do not overlap orthographic projections of the LEDs on the driving substrate; and forming a first planarization layer covering the plurality of LEDs on one side of the plurality of LEDs facing away from the driving substrate, wherein one side of the first planarization layer facing the driving substrate has a plurality of bulges filling the first recesses.

Optionally, during implementations, in the above method provided by the embodiments of the present disclosure, the forming the inorganic insulating layer on the driving substrate, and the forming the plurality of first recesses in one side of the inorganic insulating layer facing away from the driving substrate include:

forming a first insulating layer on the driving substrate;

forming a second insulating layer on one side of the first insulating layer facing away from the driving substrate; and etching the second insulating layer to form the plurality of first recesses.

DETAILED DESCRIPTION OF THE EMBODIMENTS

Figure 1:
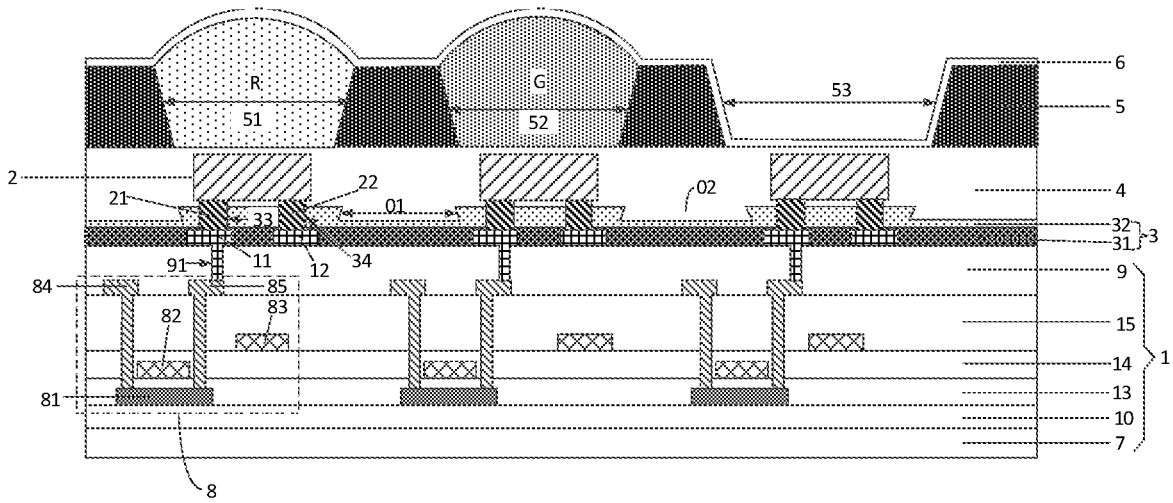
FIG. 1 is a schematic diagram of a sectional structure of a display substrate provided by an embodiment of the present disclosure.

In order to make the objective, technical solutions and advantages of the present disclosure clearer, the implementations of a display substrate, a method for preparing the display substrate, and a display apparatus provided by the embodiments of the present disclosure will be illustrated in detail below with reference to accompanying drawings.

Thicknesses and shapes of all layers of films in the accompanying drawings do not reflect the true scale of the display substrate, and only intend to illustrate the content of the present disclosure.

At present, for a QD-LED device structure, after a driving substrate is prepared, a planarization layer needs to be formed, and then a transfer electrode is formed for bonding the LED. Because the driving substrate with the transfer electrode prepared is bonded with the LED provided by a manufacturer, a material of the transfer electrode is generally Ag, Au and the like. In order to protect the transfer electrode from being oxidized before bonding, a thin silicon nitride protective layer needs to be prepared on the transfer electrode. During bonding, the transfer electrode needs to be exposed by etching so as to be electrically connected with an electrode of the LED. After bonding is completed, another planarization layer (generally white oil) needs to be formed above the LED, so as to eliminate segment difference when printing a QD material on the LED. However, a binding force of an organic-inorganic contact interface between the planarization layer above the LED and the silicon nitride protective layer below the LED is poor, the planarization layer above the LED has a risk of easy peeling-off, resulting in reduce of stability of the QD-LED device structure.

In order to solve the above problem, embodiments of the present disclosure provide a display substrate, as shown in FIG. 1 to FIG. 7, including:

a driving substrate 1;

a plurality of LEDs 2, arranged on the driving substrate 1 in an array;

an inorganic insulating layer 3, located between the driving substrate 1 and the plurality of LEDs 2; wherein a plurality of first recesses 01 are formed in one side of the inorganic insulating layer 3 facing the plurality of LEDs 2, and orthographic projections of the first recesses 01 on the driving substrate 1 do not overlap orthographic projections of the LEDs 2 on the driving substrate 1; and a first planarization layer 4, covering the plurality of LEDs 2, wherein one side of the first planarization layer 4 facing the driving substrate 1 is provided with a plurality of bulges 02 filling the first recesses 01.

According to the above display substrate provided by the embodiments of the present disclosure, the plurality of first recesses 01 are formed in one side of the inorganic insulating layer 3 facing the plurality of LEDs 2; and orthographic projections of the first recesses 01 on the driving substrate 1 do not overlap orthographic projections of the LEDs 2 on the driving substrate 1, and thus, when the first planarization layer 4 is formed on one side of the plurality of LEDs 2 facing away from the driving substrate 1, the first recesses 01 can be filled with the first planarization layer 4, so that a contact area between the first planarization layer 4 and the inorganic insulating layer 3 can be increased, a binding force between the first planarization layer 4 and the inorganic insulating layer 3 can be increased, and the risk of peeling off the first planarization layer 4 can be reduced, thereby improving the stability of a QD-LED device.

During implementations, in the above display substrate provided by the embodiments of the present disclosure, a size of the LED is generally smaller than 200 μm.

During implementations, in the above display substrate provided by the embodiments of the present disclosure, the LEDs may be Micro LEDs. Due to a small size of the Micro LED, a pixel resolution of the display substrate may be improved. For example, a size of the Micro LED is generally smaller than 100 μm. Of course, the LEDs may also be other LEDs such as Mini LEDs, which is not limited in the present disclosure. For example, when the LEDs are the Mini LEDs, a size of the Mini LED is 100 μm-200 μm.

During implementations, in the above display substrate provided by the embodiments of the present disclosure, as shown in FIG. 1, the inorganic insulating layer 3 includes: a first insulating layer 31 located between the driving substrate 1 and the plurality of LEDs 2, and a second insulating layer 32 located between the first insulating layer 31 and the plurality of LEDs 2. The material of the second insulating layer 32 is different from the material of the first insulating layer 31. For example, a material of the first insulating layer 31 is silicon nitride, and a material of the second insulating layer 32 is silicon oxide or silicon oxynitride. Because the silicon nitride, the silicon oxide and the silicon oxynitride have similar lattices, adhesive force between the first insulating layer 31 made of the silicon nitride and the second insulating layer 32 made of the silicon oxide or the silicon oxynitride is good. The plurality of first recesses 01 are formed in one side of the second insulating layer 32 facing the plurality of LEDs 2.

For a QD-Micro LED device structure, after the driving substrate is prepared, the planarization layer needs to be formed, and then a transfer electrode is formed for bonding the Micro LED. Because the driving substrate with the transfer electrode prepared is bonded with the Micro LED provided by a manufacturer, in order to protect the transfer electrode, a thin silicon nitride protective layer (i.e., the first insulating layer 31) needs to be prepared on the transfer electrode to cover the transfer electrode. Before bonding, the silicon nitride protective layer is etched through an etching process to expose the transfer electrode, so that the transfer electrode is bonded with an electrode of the LED. In order to prevent the risk of peeling-off of the subsequently formed first planarization layer 4, it needs to increase the contact area between the first insulating layer 31 and the first planarization layer 4. However, because a thickness of the first insulating layer 31 is small and is generally 0.2 μm-0.6 μm, the thickness is not enough for digging recesses in the first insulating layer 31 to increase the contact area between the first insulating layer 31 and the first planarization layer 4, thus in the present disclosure, the second insulating layer 32 with a certain thickness is disposed above the first insulating layer 31, and the additional second insulating layer 32 may be disposed to be thick, on which the required recess structure may be prepared. Therefore, by disposing the plurality of first recesses 01 in one side of the second insulating layer 32 facing the plurality of LEDs 2, when the first planarization layer 4 is subsequently formed, the first recesses 01 are filled with the first planarization layer 4, thereby increasing the contact area between the first planarization layer 4 and the second insulating layer 32. In addition, the second insulating layer 32 is made of different materials similar to the lattice of the first insulating layer 31, such as silicon oxide or silicon oxynitride. Because the lattices of the silicon nitride, the silicon oxide and the silicon oxynitride are similar, the adhesive force between the first insulating layer 31 made of the silicon nitride and the second insulating layer 32 made of the silicon oxide or the silicon oxynitride is good. Therefore, the present disclosure can increase the contact area between the first planarization layer 4 and the second insulating layer 32, avoid the risk of falling-off of the first planarization layer 4, thereby improving the stability of the device.

During implementations, in the above display substrate provided by the embodiments of the present disclosure, as shown in FIG. 1, a thickness of the first insulating layer 31 may be 0.2 μm-1 μm, and a thickness of the second insulating layer may be 2 μm-3 μm.

Figure 2:
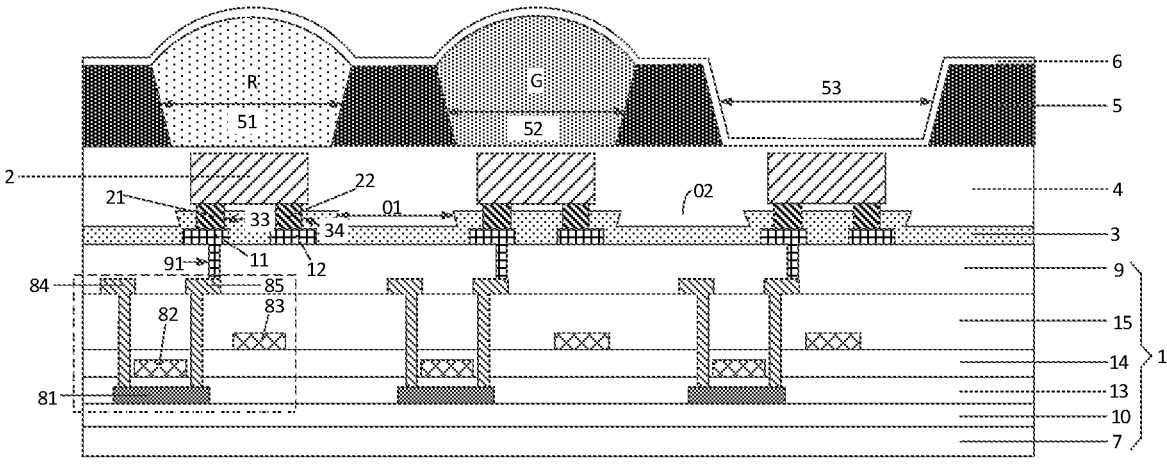
FIG. 2 is a schematic diagram of a sectional structure of another display substrate provided by an embodiment of the present disclosure.

During implementations, in the above display substrate provided by the embodiments of the present disclosure, as shown in FIG. 2, the inorganic insulating layer 3 may also be a single layer, and a thickness of the single layer of the inorganic insulating layer 3 is 2 μm-3 μm. That is, when forming the above silicon nitride protective layer for protecting the transfer electrode, the silicon nitride protective layer is directly prepared into a film layer (i.e., the inorganic insulating layer 3) with a thickness of 2 μm-3 μm, then the plurality of first recesses 01 are formed by etching the single layer of inorganic insulating layer 3. In this way, compared with a solution in FIG. 1, a step of preparing an insulating layer one time may be saved, and a manufacturing process is simplified.

During implementations, the above display substrate provided by the embodiments of the present disclosure, as shown in FIG. 2, may further include a blocking dam structure 5 located on one side of the first planarization layer 4 facing away from the driving substrate 1. The blocking dam structure 5 is provided with a plurality of pixel openings, and the pixel openings are in one-to-one correspondence with the LEDs 2. The blocking dam structure 5 may prevent crosstalk between adjacent sub pixels during light emission.

The pixel openings include a first sub-pixel opening 51 and a second sub-pixel opening 52. A red quantum dot color film R is disposed in the first sub-pixel opening 51, and a green quantum dot color film G is disposed in the second sub-pixel opening 52.

It should be noted that the above pixel openings are in one-to-one correspondence with the LEDs 2, which means that orthographic projections of the pixel openings on the driving substrate 1 and orthographic projections of the LEDs 2 on the driving substrate 1 have an overlapping area. For example, an orthographic projection of the first sub-pixel opening 51 on the driving substrate 1 and the orthographic projection of the LEDs 2 on the driving substrate 1 have an overlapping area, an orthographic projection of the second sub-pixel opening 52 on the driving substrate 1 and the orthographic projection of the LED 2 on the driving substrate 1 have an overlapping area, and an orthographic projection of a third sub-pixel opening 53 introduced later on the driving substrate 1 and the orthographic projection of the LED 2 on the driving substrate 1 also have an overlapping area. FIG. 1-FIG. 7 show that the pixel openings cover the LEDs 2. Of course, it may also be that the LEDs 2 cover the pixel openings, or the LEDs 2 and the pixel openings partially overlap.

The LEDs 2 generally emit blue light, so the quantum dot color film only including a red quantum dot color film layer R and a green quantum dot color film layer G is arranged to achieve full color display.

During implementations, because a photoluminescent quantum dot material has a wide color gamut and pure light color, a material of the color film layer in the embodiments of the present disclosure is quantum dots.

Figure 3:
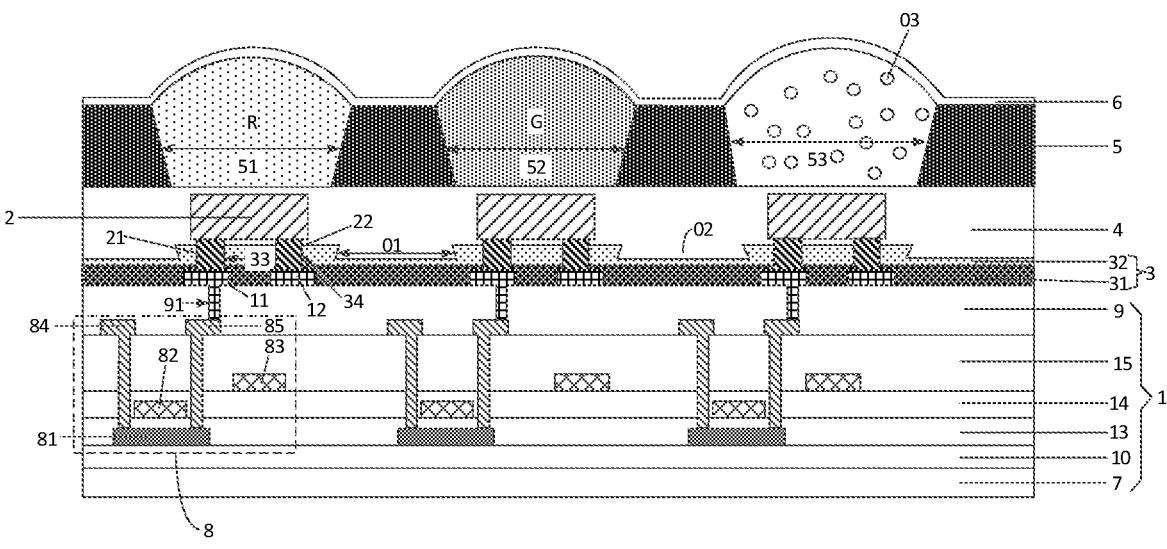
FIG. 3 is a schematic diagram of a sectional structure of another display substrate provided by an embodiment of the present disclosure.

During implementations, in the above display substrate provided by the embodiments of the present disclosure, as shown in FIG. 3, the pixel openings further include a third sub-pixel opening 53, and the third sub-pixel opening 53 is filled with scattered particles 03. For example, the scattered particles 03 are doped in a resin material, and then the resin material doped with the scattered particles 03 is used to fill a depression of the third sub-pixel opening 53. The scattered particles can enhance a light-emitting effect and increase a light-emitting angle.

During implementations, in the above display substrate provided by the embodiments of the present disclosure, as shown in FIG. 1-FIG. 7, the first planarization layer 4 may internally have the plurality of scattered particles (not shown). For example, a material of the first planarization layer 4 is generally resin. By doping the scattered particles in the resin, a role of planarize the segment difference is achieved, and the light-emitting effect of the LEDs 2 and the light-emitting angle may further be enhanced.

Figure 4:
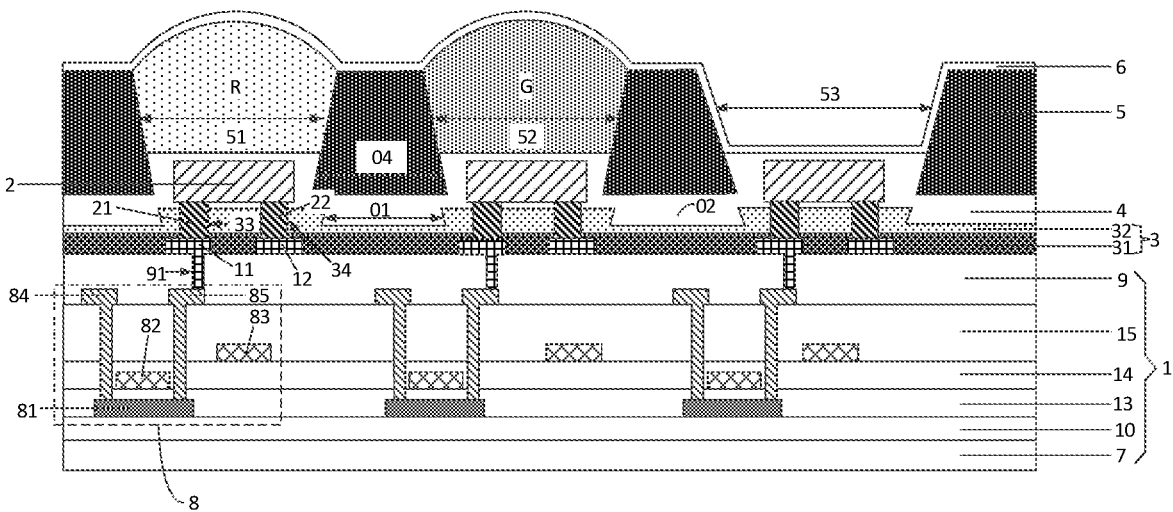
FIG. 4 is a schematic diagram of a sectional structure of another display substrate provided by an embodiment of the present disclosure.

During implementations, since there are a plurality of scattered particles in the first planarization layer, the scattered particles can increase the light-emitting angle. In order to further prevent the crosstalk between the adjacent pixels, in the above display substrate provided by the embodiments of the present disclosure, as shown in FIG. 4, a plurality of second recesses 04 are disposed in one side of the first planarization layer 4 facing the blocking dam structure 5, and the second recesses 04 are filled with the blocking dam structure 5. This is equivalent to increasing a height of the blocking dam structure 5 towards the LEDs 2, which can block blue light emitted by the LEDs 2 from being shined on the adjacent pixels, thus improving the light-emitting efficiency.

During implementations, the above display substrate provided by the embodiments of the present disclosure, as shown in FIG. 1-FIG. 7, further includes an encapsulation layer 6 covering the red quantum dot color film R, the green quantum dot color film G and the blocking dam structure 5. For example, the encapsulation layer 6 may include an inorganic layer, an organic layer and an inorganic layer which are alternatively disposed. The encapsulation layer is used to block external water vapor, protect the quantum dot material from contacting water, oxygen, and the like, so as to improve the stability and service life of the device.

Figure 5:
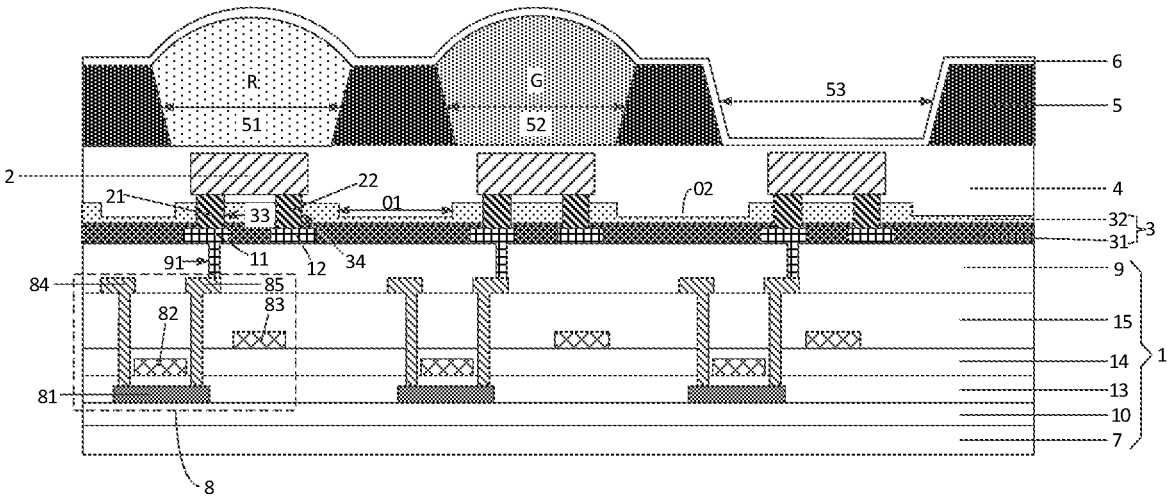
FIG. 5 is a schematic diagram of a sectional structure of another display substrate provided by an embodiment of the present disclosure.
Figure 6:
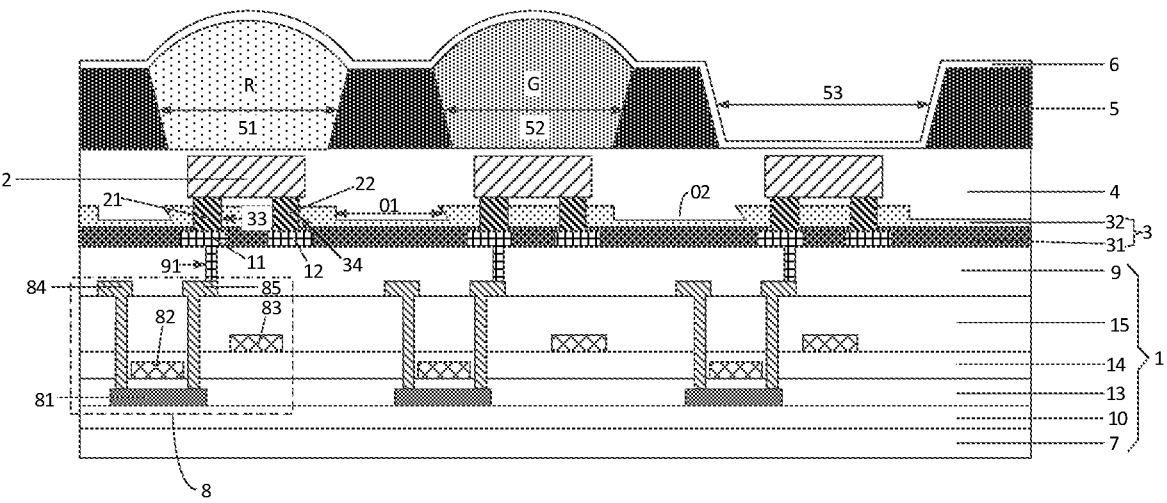
FIG. 6 is a schematic diagram of a sectional structure of another display substrate provided by an embodiment of the present disclosure.
Figure 7:
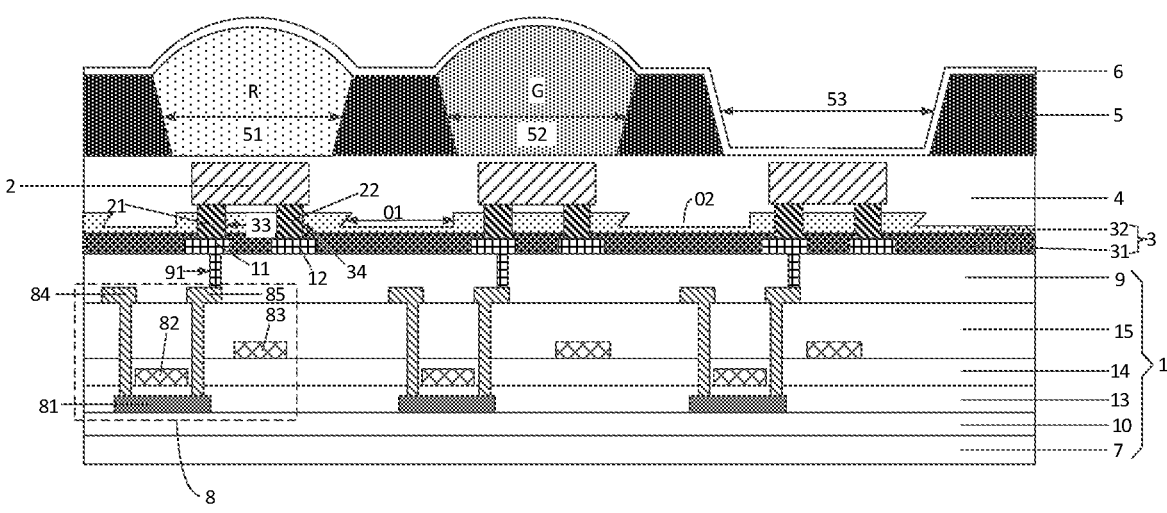
FIG. 7 is a schematic diagram of a sectional structure of another display substrate provided by an embodiment of the present disclosure.

During implementations, in the above display substrate provided by the embodiments of the present disclosure, in a direction perpendicular to a thickness of a base substrate, a cross section shape of the first recess may be one or a combination of an isosceles trapezoid, a right-angled trapezoid and a rectangle. For example, as shown in FIG. 1-FIG. 4, the cross section shape of the first recess 01 is the isosceles trapezoid; as shown in FIG. 5, the cross section shape of the first recess 01 is the rectangle; and as shown in FIG. 6 and FIG. 7, the cross section shape of the first recess 01 is the right-angled trapezoid.

Of course, during implementations, the cross section shape of the first recess is not limited to the above listed regular shapes, but also may be other irregular shapes. As long as a recess is disposed on one side of the inorganic insulating layer facing away from the driving substrate, so that the recess is filled with the first planarization layer so as to increase the contact area between the first planarization layer and the inorganic insulating layer, all of which belong to the scope of the protection of the present disclosure, and will not be listed one by one here.

During implementations, in the above display substrate provided by the embodiments of the present disclosure, a top view of the inorganic insulating layer may be rectangular or circular or other shapes.

During implementations, in the above display substrate provided by the embodiments of the present disclosure, as shown in FIG. 1-FIG. 7, a depth of the first recess 01 may be 0.1 μm-0.6 μm.

It should be noted that the above first recesses in the embodiments of the present disclosure are illustrated by taking an example of the first recesses not penetrating through the inorganic insulating layer. Of course, during implementations, the first recesses may also completely penetrate through the inorganic insulating layer.

During implementations, in the above display substrate provided by the embodiments of the present disclosure, as shown in FIG. 1-FIG. 7, a thickness of the first planarization layer 4 may be 8 μm-10 μm.

During implementations, in the above display substrate provided by the embodiments of the present disclosure, as shown in FIG. 1-FIG. 7, the driving substrate 1 includes: a base substrate 7; a drive circuit 8 located on one side of the base substrate 7 facing the LEDs 2, wherein the drive circuit 8 includes an active layer 81, a first gate layer 82, a second gate layer 83, a source electrode 84 and a drain electrode 85; a second planarization layer 9 located on one side of the drive circuit 8 facing the LEDs 2, and a first electrode 11 and a second electrode 12 which are located on one side of the second planarization layer 9 facing the Micro LEDs 2. The first electrode 11 is electrically connected with the drive circuit 8 through a first via hole 91 penetrating through the second planarization layer 9, that is, the first electrode 11 is electrically connected with the drain electrode 85 through the first via hole 91 penetrating through the second planarization layer 9. The second electrode 12 is grounded. For example, the first electrode 11 and the second electrode 12 are the transfer electrodes (pins) for outsourcing and transfer printing of the LEDs 2, and materials of the first electrode 11 and the second electrode 12 are Ag, Au and the like.

One side of the LEDs 2 facing the driving substrate 1 includes a third electrode 21 and a fourth electrode 22, the third electrode 21 is electrically connected with the first electrode 11 through a second via hole 33 penetrating through the inorganic insulating layer 3, and the fourth electrode 22 is electrically connected with the second electrode 12 through a third via hole 34 penetrating through the inorganic insulating layer 3. For example, when the LEDs 2 emit light, a drive current is input to the LEDs 2 through the drive circuit 8. The specific light-emitting principle is the same as that of related art, and will not be detailed here.

During implementations, as shown in FIG. 1-FIG. 7, the driving substrate 1 may further include a buffer layer 10 located between the base substrate 7 and the drive circuit 8, a first gate insulating layer 13 located between the active layer 81 and the first gate layer 82, a second gate insulating layer 14 located between the first gate layer 82 and the second gate layer 83, and an interlayer insulating layer 15 located between the second gate layer 83 and the source electrode 84 as well as the drain electrode 85.

During implementations, in the above display substrate provided by the embodiments of the present disclosure, as shown in FIG. 1-FIG. 7, in a direction of the driving substrate 1 pointing to the LEDs 2, a thickness of the third electrode 21 is the same as a thickness of the fourth electrode 22, and the thickness of the third electrode 21 is greater than a depth of the second via hole 33. By setting the thickness of the third electrode 21 to be greater than the depth of the second via hole 33, when the third electrode 21 of the LEDs 2 is electrically connected with the first electrode 11 through the second via hole 33 and the fourth electrode 22 of the LEDs 2 is electrically connected with the second electrode 12 through the third via hole 34, it can be ensured that both the third electrode 21 and the fourth electrode 22 can go deep into the bottom of the corresponding via hole to be electrically connect with the corresponding electrode, that is, good contact between a P/N pad (the third electrode 21 and the fourth electrode 22) and the pins of the driving substrate (the first electrode 11 and the second electrode 12) in the transfer printing process of the LEDs 2 is ensured.

Figure 8:
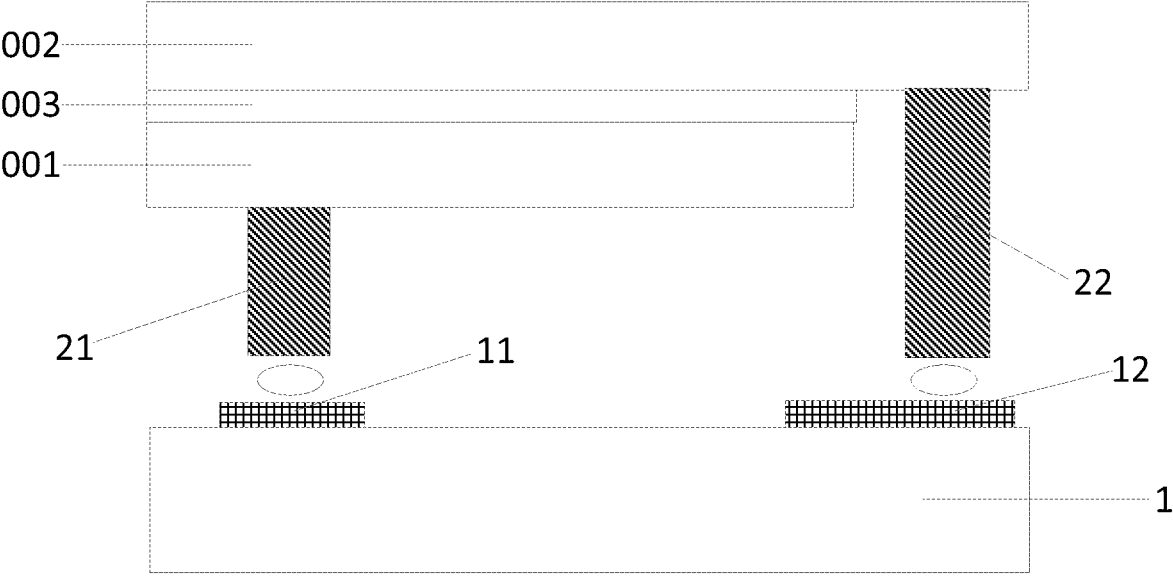
FIG. 8 is a schematic structural diagram of a LED provided by an embodiment of the present disclosure.

During implementations, in the above display substrate provided by the embodiments of the present disclosure, as shown in FIG. 8, a structure of the LEDs 2 includes: a P-type semiconductor layer 001, an N-type semiconductor layer 002, an active layer 003 located between the P-type semiconductor layer 001 and the N-type semiconductor layer 002, the third electrode 21 (P-type pad), and the fourth electrode 22 (N-type pad). The LEDs are transfer printed to the driving substrate 1 through the transfer electrode (the first electrode 11 and the second electrode 12). The LEDs are of an inorganic material with good stability compared with an organic material.

During implementations, the above display substrate provided by the embodiments of the present disclosure may further include other functional film layers well known to those skilled in the art, which is not described in detail here.

It should be noted that in the above display substrates of FIG. 1-FIG. 7 provided by the embodiments of the present disclosure, a material of the blocking dam structure 5 is generally hydrophobic. When the quantum dot color film is prepared by adopting a solution method (printing or ink-jet printing), a shape of the quantum dot color film far from a surface of the driving substrate 1 is curved, that is, in the direction perpendicular to the thickness of the driving substrate 1, cross sections of the red quantum dot color film R and the green quantum dot color film R are curved surfaces.

Figure 9:
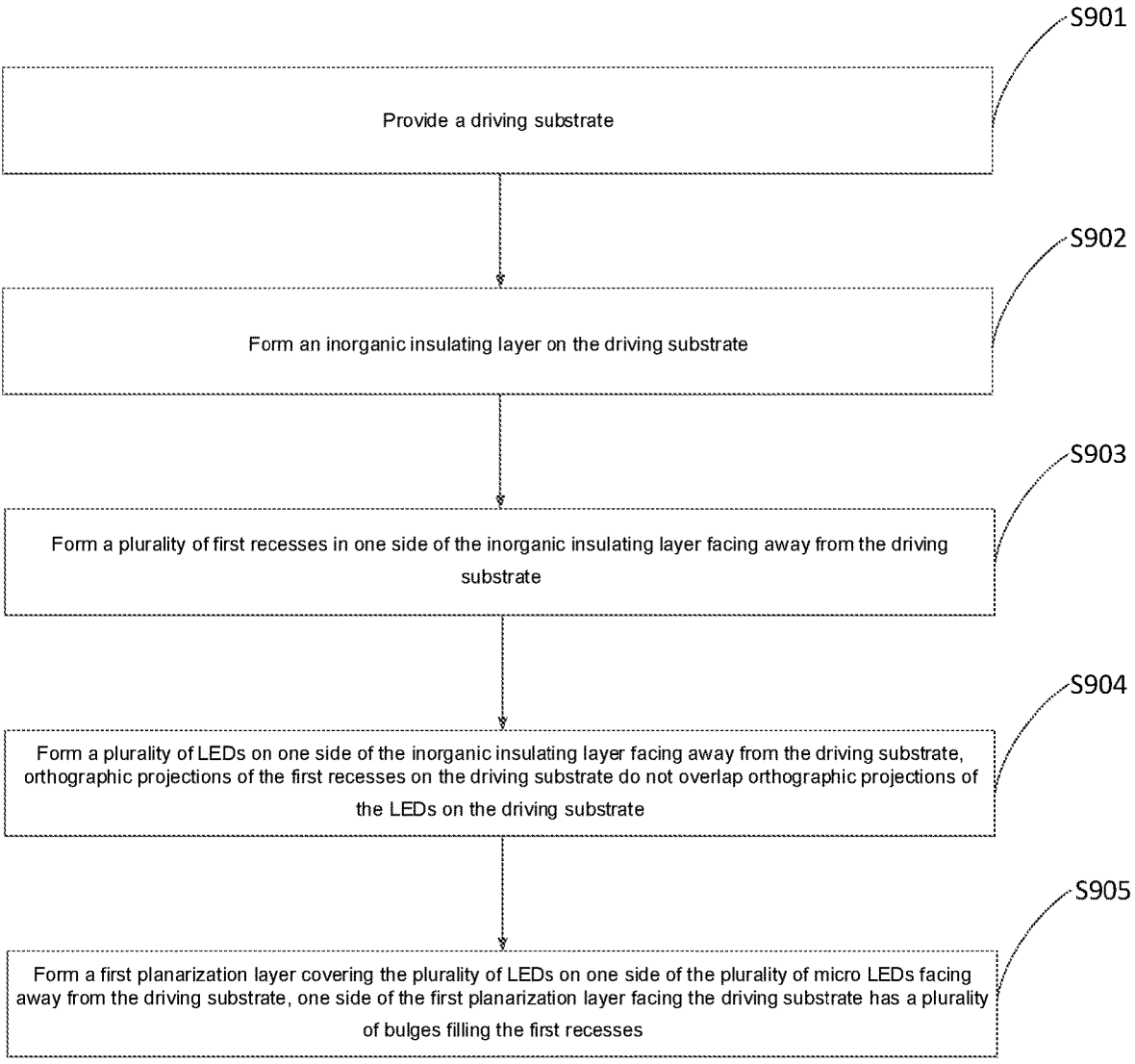
FIG. 9 is a schematic flow diagram of a method for preparing a display substrate provided by an embodiment of the present disclosure.

Based on the same inventive concept, embodiments of the present disclosure further provide a method for preparing a display substrate, referring to FIG. 9, including the following steps.

S901, a driving substrate is provided.

S902, an inorganic insulating layer is formed on the driving substrate.

S903, a plurality of first recesses are formed in one side of the inorganic insulating layer facing away from the driving substrate.

S904, a plurality of LEDs are formed on one side of the inorganic insulating layer facing away from the driving substrate. Orthographic projections of the first recesses on the driving substrate do not overlap orthographic projections of the LEDs on the driving substrate.

S905, a first planarization layer covering the plurality of LEDs is formed on one side of the plurality of LEDs facing away from the driving substrate. One side of the first planarization layer facing the driving substrate is provided with a plurality of bulges filling the first recesses.

According to the above method for preparing the display substrate provided by the embodiments of the present disclosure, the plurality of first recesses are formed in one side of the inorganic insulating layer facing away from the driving substrate; and the orthographic projections of the first recesses on the driving substrate do not overlap orthographic projections of the LEDs on the driving substrate, and thus, when the first planarization layer is formed on one side of the plurality of LEDs facing away from the driving substrate, the first recesses can be filled with the first planarization layer, so that a contact area between the first planarization layer and the inorganic insulating layer can be increased, a binding force between the first planarization layer and the inorganic insulating layer can be increased, and the risk of peeling off the first planarization layer can be reduced, thereby improving the stability of a QD-Micro LED device.

Figure 10:
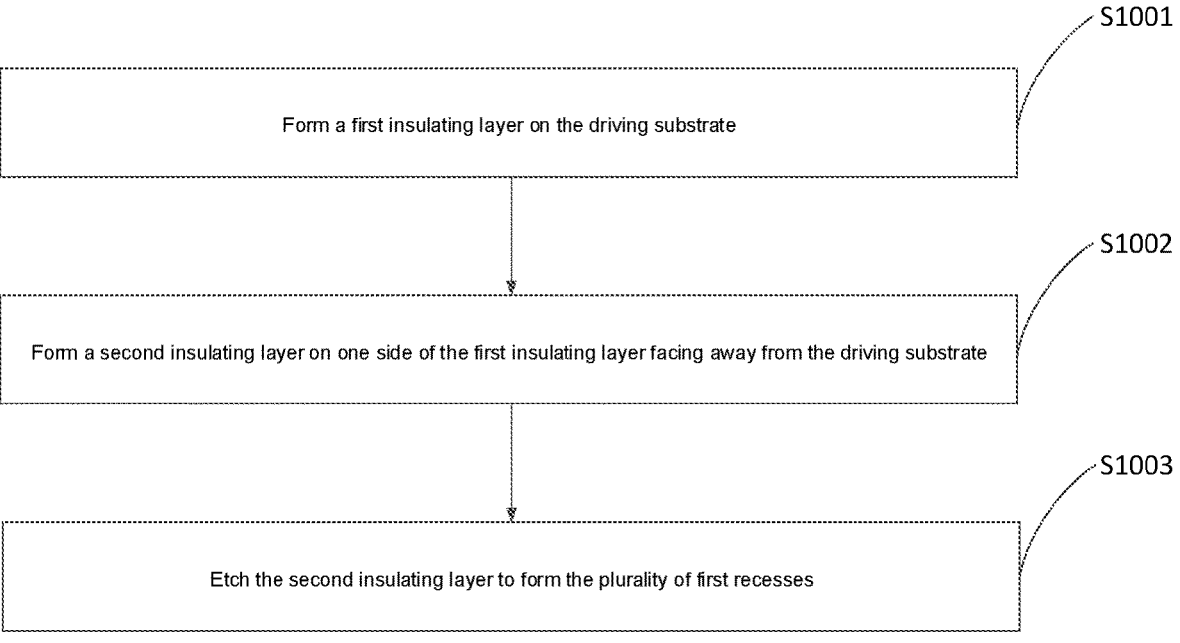
FIG. 10 is another schematic flow diagram of a method for preparing a display substrate provided by an embodiment of the present disclosure.

During implementations, in the above method provided by the embodiments of the present disclosure, the forming the inorganic insulating layer on the driving substrate, and the forming the plurality of first recesses in one side of the inorganic insulating layer facing away from the driving substrate, as shown in FIG. 10, include:

S1001, a first insulating layer is formed on the driving substrate;

S1002, a second insulating layer is formed on one side of the first insulating layer facing away from the driving substrate; and S1003, the second insulating layer is etched to form the plurality of first recesses.

The method for preparing the display substrate shown in FIG. 1 is illustrated in detail below.

Figure 11A:
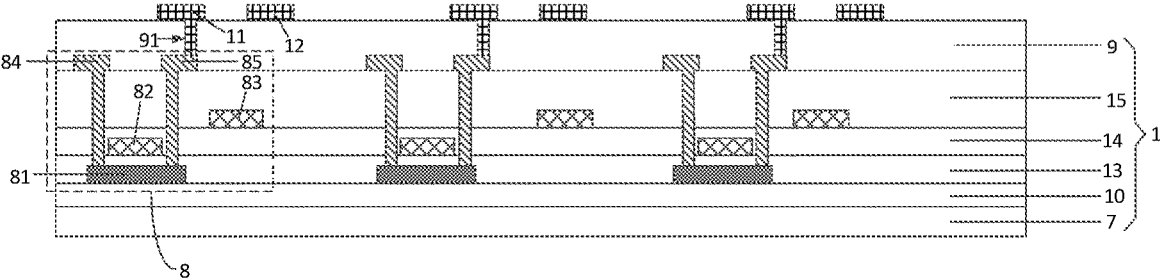
FIG. 11A-FIG. 11H are respectively schematic structural diagrams of a display substrate after each step is executed in the method for preparing the display substrate provided by an embodiment of the present disclosure.

(1) the driving substrate 1 is provided, a method for preparing the driving substrate 1 is the same as that of the related art, which will not be detailed here, as shown in FIG. 11A.

Figure 11B:
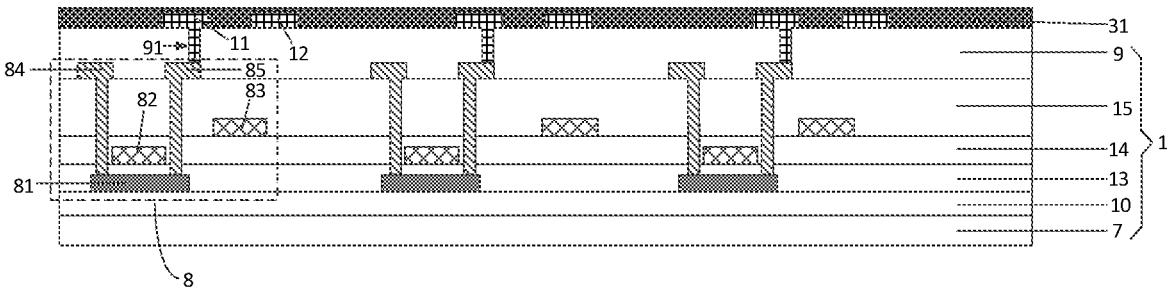

(2) the first insulating layer 31 is formed on the driving substrate 1, as shown in FIG. 11B. A material of the first insulating layer 31 is silicon nitride.

Figure 11C:
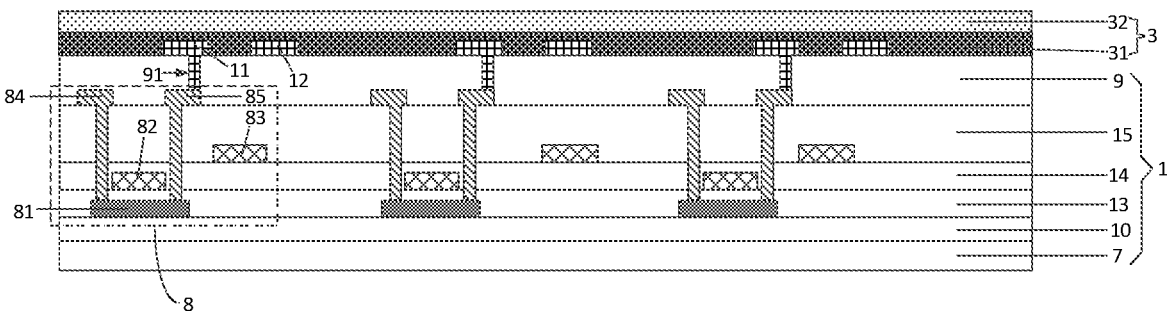

(3) the second insulating layer 32 is formed on one side of the first insulating layer 31 facing away from the driving substrate 1, as shown in FIG. 11C. A material of the second insulating layer 32 is silicon oxide or silicon oxynitride.

Figure 11D:
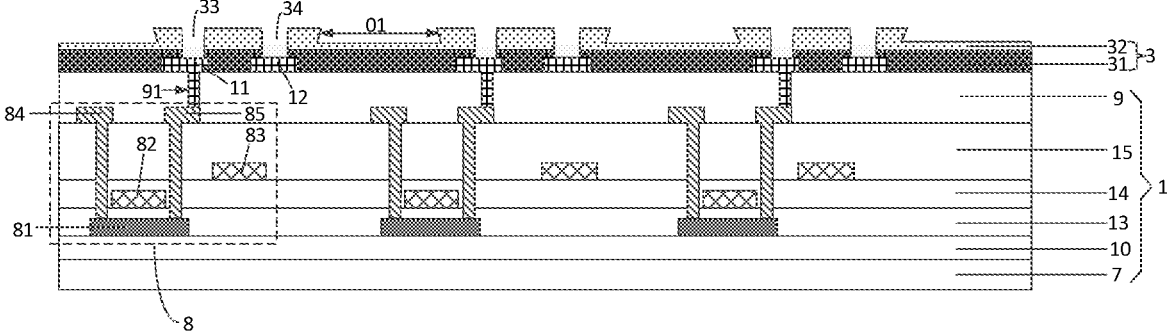

(4) the second insulating layer 32 is etched to form the plurality of first recesses 01, a plurality of second via holes 33, and a plurality of third via holes 34. The second via hole 33 and the third via hole 34 correspondingly expose a first electrode 11 and a second electrode 12 on the driving substrate 1, as shown in FIG. 11D.

Figure 11E:
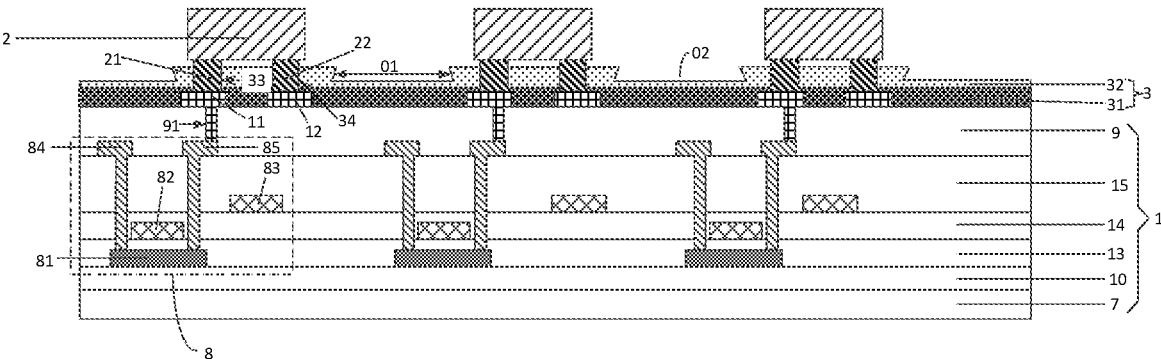

(5) the LEDs 2 are bonded to the driving substrate 1 by means of bonding, that is, a third electrode 21 of the LEDs 2 is electrically connected with the first electrode 11 on the driving substrate 1, and a fourth electrode 22 of the LEDs 2 is electrically connected with the second electrode 12 on the driving substrate 1, as shown in FIG. 11E.

Figure 11F:
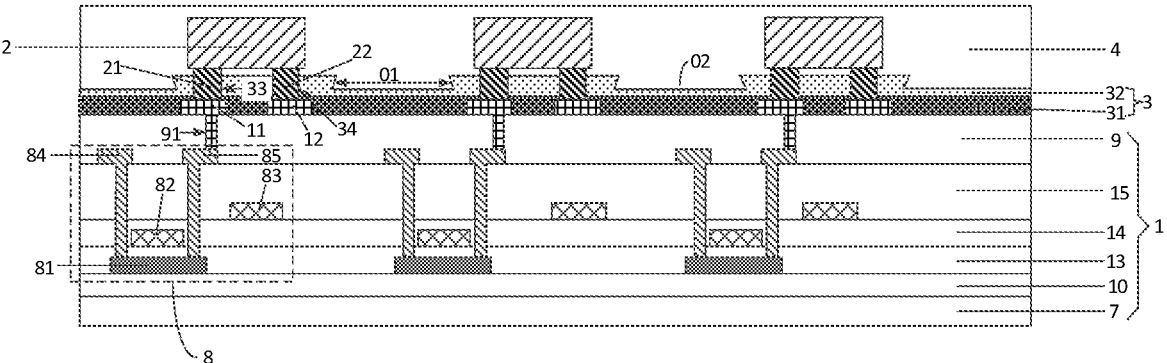

(6) the first planarization layer 4 covering the plurality of LEDs 2 is formed on one side of the plurality of LEDs 2 facing away from the driving substrate 1, and the first recesses 01 are filled with the first planarization layer 4, as shown in FIG. 11F.

Figure 11G:
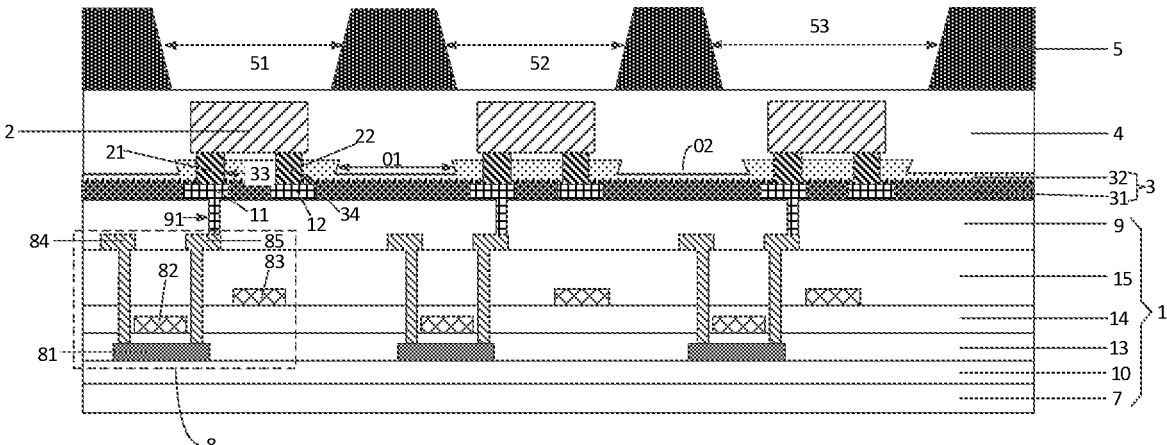

(7) a blocking dam structure 5 with a plurality of pixel openings is formed on one side of the first planarization layer 4 facing away from the driving substrate 1, as shown in FIG. 11G.

Figure 11H:
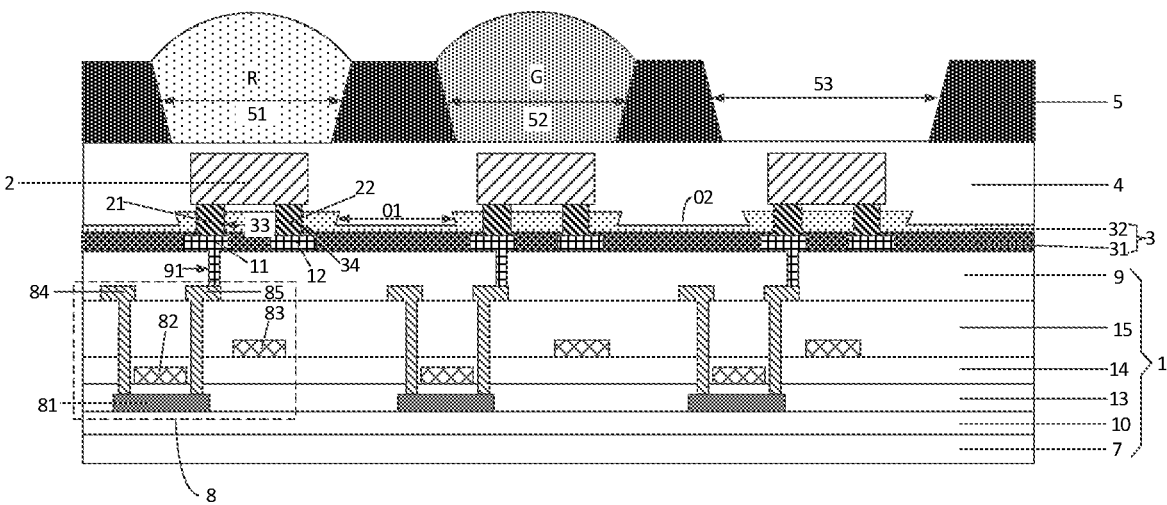

(8) color film layers of different colors (a red quantum dot color film layer R and a green quantum dot color film layer G) are formed in the pixel openings by printing or ink-jet printing, as shown in FIG. 11H.

(9) an encapsulation layer 6 covering the color film layers and the blocking dam structure 5 is formed, as shown in FIG. 1.

It should be noted that the method of the embodiments of the present disclosure is illustrated by taking the inorganic insulating layer shown in FIG. 1 including the first insulating layer and the second insulating layer as an example. The method for preparing the display substrate in FIG. 2 is different from that for preparing the display substrate in FIG. 1 only in that when the inorganic insulating layer 3 is formed, the inorganic insulating layer with the thickness of 2 μm-3 μm is directly formed one time. The method for preparing the display substrate in FIG. 3 is different from that for preparing the display substrate in FIG. 1 only in that a third sub-pixel opening is filled with scattered particles when the color film layer is formed. The method for preparing the display substrate in FIG. 4 is different from that for preparing the display substrate in FIG. 1 only in that after the first planarization layer 4 is formed, the first planarization layer 4 is etched to form the plurality of second recesses 04, so that the second recesses 04 are filled with the blocking dam structure. The method for preparing the display substrate in FIG. 5-FIG. 7 is different from that for preparing the display substrate in FIG. 1 only in that a shape of the first recess 01 formed by etching is different, which can be achieved by controlling the exposure amount at different positions of photoresist.

During implementations, the above touch display substrate provided by the embodiments of the present disclosure may be: any product or component with a display function, such as a mobile phone, a tablet computer, a television, a displayer, a notebook computer, a digital photo frame, and a navigator. It should be understood by a person of ordinary skill in the art that the touch display substrate should have other essential constituent parts, which is not repeated here and should not be regarded as limitation to the present disclosure. Implementation of the display apparatus may refer to embodiments of the above display substrate, and repetitions are omitted.

Embodiments of the present disclosure provide the display substrate, the method for preparing the display substrate, and the display apparatus. The display substrate includes: the driving substrate; the plurality of LEDs, wherein the plurality of LEDs are arranged on the driving substrate in an array; the inorganic insulating layer, located between the driving substrate and the plurality of LEDs; one side of the inorganic insulating layer facing the plurality of LEDs is provided with the plurality of first recesses, and the orthographic projections of the first recesses on the driving substrate do not overlap the orthographic projections of the LEDs on the driving substrate; and the first planarization layer, located on one side of the plurality of LEDs facing away from the driving substrate, wherein one side of the first planarization layer facing the driving substrate has a plurality of bulges filling the first recesses. According to the present disclosure, the plurality of first recesses are formed in one side of the inorganic insulating layer facing the plurality of LEDs; and the orthographic projections of the first recesses on the driving substrate do not overlap the orthographic projections of the LEDs on the driving substrate, and thus, when the first planarization layer is formed on one side of the plurality of LEDs facing away from the driving substrate, the first recesses can be filled with the first planarization layer, so that a contact area between the first planarization layer and the inorganic insulating layer can be increased, a binding force between the first planarization layer and the inorganic insulating layer can be increased, and the risk of peeling off the first planarization layer can be reduced, thereby improving the stability of a QD-LED device.

Obviously, those skilled in the art can make various modifications and variations to the present disclosure without departing from the spirit and scope of the present disclosure. In this way, if these modifications and variations of the present disclosure fall within the scope of the claims of the present disclosure and their equivalent art, the present disclosure also intends to include these modifications and variations.

What is claimed is:

1. A display substrate, comprising:
a driving substrate;
a plurality of LEDs, arranged on the driving substrate in an array;
an inorganic insulating layer, located between the driving substrate and the plurality of LEDs; wherein a plurality of first recesses are provided in one side of the inorganic insulating layer facing the plurality of LEDs, and orthographic projections of all of the plurality of first recesses on the driving substrate do not overlap orthographic projections of the LEDs on the driving substrate;
a first planarization layer, covering the plurality of LEDs, wherein the first planarization layer comprises a plurality of bulges filling the first recesses provided on one side of the first planarization layer facing the driving substrate; and
a blocking dam structure located on one side of the first planarization layer facing away from the driving substrate;
wherein the blocking dam structure is provided with a plurality of pixel openings penetrating through the blocking dam structure, the pixel openings are in one-to-one correspondence with the LEDs, and the orthographic projections of the pixel openings on the driving substrate completely cover the orthographic projections of the LEDs on the driving substrate; and
the pixel openings comprise:
a first sub-pixel opening, and
a second sub-pixel opening,
wherein a red quantum dot color film is disposed in the first sub-pixel opening, and a green quantum dot color film is disposed in the second sub-pixel opening;
one side of the first planarization layer facing the blocking dam structure is provided with a plurality of second recesses, and the second recesses are filled with the blocking dam structure.

2. The display substrate of claim 1, wherein the inorganic insulating layer comprises:
a first insulating layer located between the driving substrate and the plurality of LEDs, and
a second insulating layer located between the first insulating layer and the plurality of LEDs;
wherein the second insulating layer and the first insulating layer are different in material; and
the plurality of first recesses are provided in one side of the second insulating layer facing the plurality of LEDs.

3. The display substrate of claim 2, wherein:
a thickness of the first insulating layer is 0.2 μm-1 μm, and
a thickness of the second insulating layer is 2 μm-3 μm.

4. The display substrate of claim 1, wherein:
the inorganic insulating layer is a single inorganic insulating layer, and a thickness of the single inorganic insulating layer is 2 μm-3 μm.

5. The display substrate of claim 1, wherein the pixel openings further comprise:
a third sub-pixel opening;
wherein the third sub-pixel opening is filled with scattered particles.

6. The display substrate of claim 1, wherein the first planarization layer internally is provided with a plurality of scattered particles.

7. The display substrate of claim 1, further comprising:

an encapsulation layer, covering the red quantum dot color film, the green quantum dot color film, and the blocking dam structure.

8. The display substrate of claim 1, wherein in a direction perpendicular to a thickness of the driving substrate, a cross section shape of the first recess is one or a combination of an isosceles trapezoid, a right-angled trapezoid, or a rectangle.

9. The display substrate of claim 1, wherein the driving substrate comprises:

a base substrate, a drive circuit on one side of the base substrate facing the LEDs, a second planarization layer on one side of the drive circuit facing the LEDs, and a first electrode and a second electrode which are located on one side of the second planarization layer facing the LEDs;

wherein the first electrode is electrically connected with the drive circuit through a first via hole penetrating through the second planarization layer, and the second electrode is grounded; and a third electrode and a fourth electrode are located on one side of the LEDs facing the driving substrate, the third electrode is electrically connected with the first electrode through a second via hole penetrating through the inorganic insulating layer, and the fourth electrode is electrically connected with the second electrode through a third via hole penetrating through the inorganic insulating layer.

10. The display substrate of claim 9, wherein a thickness of the third electrode is greater than a depth of the second via hole.

11. The display substrate of claim 10, wherein the third electrode comprises a portion located in the second via hole and a portion extending outward from the second via hole in a direction away from the base substrate.

12. The display substrate of claim 9, wherein the third electrode and the fourth electrode are located on a side of the first electrode and the second electrode facing away from the base substrate.

13. The display substrate of claim 1, wherein the LEDs are Micro LEDs.

14. A display apparatus, comprising the display substrate according to claim 1.

\* \* \* \* \*